United States Patent
Shimazawa et al.

(10) Patent No.: US 6,895,658 B2
(45) Date of Patent: May 24, 2005

(54) METHODS OF MANUFACTURING A TUNNEL MAGNETORESISTIVE ELEMENT, THIN-FILM MAGNETIC HEAD AND MEMORY ELEMENT

(75) Inventors: Koji Shimazawa, Chuo-ku (JP); Satoru Araki, Chuo-ku (JP)

(73) Assignee: TDK Corporation, Tokyo (JP)

( * ) Notice: Subject to any disclaimer, the term of this patent is extended or adjusted under 35 U.S.C. 154(b) by 50 days.

(21) Appl. No.: 10/425,741

(22) Filed: Apr. 30, 2003

(65) Prior Publication Data

US 2003/0184924 A1 Oct. 2, 2003

Related U.S. Application Data

(62) Division of application No. 09/749,582, filed on Dec. 28, 2000, now abandoned.

(30) Foreign Application Priority Data

Jan. 12, 2000 (JP) .................................. 2000-003265

(51) Int. Cl.7 .......................... G11B 5/127; H04R 31/00
(52) U.S. Cl. .............................. 29/603.14; 29/603.07; 29/603.11; 29/603.13; 29/603.15; 29/603.16; 29/603.18; 216/39; 216/41; 360/324; 360/325; 360/326; 360/327; 365/158; 365/173; 427/127; 427/128
(58) Field of Search ................... 29/603.07, 603.11, 29/603.13–603.16, 603.18, 603.17; 360/324–327; 365/158, 173; 427/127, 128; 216/39, 41

(56) References Cited

U.S. PATENT DOCUMENTS

| | | | | |
|---|---|---|---|---|
| 5,959,810 A | * | 9/1999 | Kakihara et al. | 360/324.12 |
| 5,985,162 A | * | 11/1999 | Han et al. | 216/22 |
| 5,986,858 A | * | 11/1999 | Sato et al. | 360/324.2 |
| 6,052,261 A | * | 4/2000 | Watanabe et al. | 204/192.1 |

FOREIGN PATENT DOCUMENTS

JP  11175920 A  *  7/1999  ............ G11B/5/39

OTHER PUBLICATIONS

"Spin Tunneling Magnetoresistive Effect In Ferromagnet/Al/sub 2/O/sub 3/Ferromagnet Junctions"; Miyazaki, T.; Tezuka, N.; Magnetic Recording Conference 1995. 'Magnetic Recording Heads'., Digest of the , Jul. 10–12, 1995; pp: E5–E5.*

* cited by examiner

*Primary Examiner*—Paul D Kim
(74) *Attorney, Agent, or Firm*—Oliff & Berridge, PLC

(57) ABSTRACT

A TMR element includes: a free layer formed on a lower gap layer; a tunnel barrier layer formed on the free layer; and a pinned layer formed on the tunnel barrier layer. The pinned layer and the tunnel barrier layer have sidewalls formed through etching. The TMR element further comprises a deposition layer made of a material that is separated by etching and deposits on the sidewalls and undergoes oxidation.

6 Claims, 20 Drawing Sheets

| joint area [$\mu m^2$] | TMR element resistance [$\Omega$] | resistance change rate [%] |
|---:|---:|---:|
| 0.36 | 114.4 | 18.8 |
| 0.64 | 70.1 | 20.3 |
| 1 | 48.7 | 21.9 |
| 4 | 14.8 | 24.7 |
| 9 | 7.4 | 26.3 |

| joint area [$\mu m^2$] | TMR element resistance [$\Omega$] | resistance change rate [%] |
|---|---|---|
| 0.36 | 137.3 | 24.1 |
| 0.64 | 79.5 | 24.8 |
| 1 | 51.8 | 25.6 |
| 4 | 15.3 | 27.1 |
| 9 | 7.8 | 27.7 |

FIG. 16

| joint area [$\mu m^2$] | TMR element resistance [$\Omega$] | resistance change rate [%] |
|---|---|---|
| 0.36 | 140.1 | 25.1 |
| 0.64 | 80.2 | 25.8 |
| 1 | 52.3 | 26.6 |
| 4 | 15.6 | 28.2 |
| 9 | 8.1 | 28.8 |

FIG. 17

| joint area [μm²] | TMR element resistance [Ω] | resistance change rate [%] |
|---|---|---|
| 0.36 | 147.0 | 25.6 |
| 0.64 | 83.6 | 26.3 |
| 1 | 54.1 | 27.2 |
| 4 | 15.7 | 28.7 |
| 9 | 8.3 | 29.4 |

| joint area [$\mu m^2$] | TMR element resistance [$\Omega$] | resistance change rate [%] |
|---|---|---|
| 0.36 | 132.0 | 23.5 |
| 0.64 | 76.4 | 24.3 |
| 1 | 50.3 | 25.2 |
| 4 | 13.2 | 26.8 |
| 9 | 7.8 | 27.1 |

| joint area [μm²] | TMR element resistance [Ω] | resistance change rate [%] |
|---|---|---|
| 0.36 | 134.7 | 24.0 |
| 0.64 | 77.1 | 24.8 |
| 1 | 50.8 | 25.7 |
| 4 | 13.6 | 27.3 |
| 9 | 7.8 | 27.6 |

FIG. 24

| joint area [μm²] | TMR element resistance [Ω] | resistance change rate [%] |
|---|---|---|
| 0.36 | 141.5 | 24.4 |
| 0.64 | 80.5 | 25.3 |
| 1 | 51.7 | 26.2 |
| 4 | 14.1 | 27.9 |
| 9 | 8.0 | 28.2 |

FIG. 25

| joint area [$\mu m^2$] | TMR element resistance [$\Omega$] | resistance change rate [%] |
|---|---|---|
| 0.36 | 120.9 | 19.3 |
| 0.64 | 71.2 | 20.3 |
| 1 | 49.0 | 22.5 |
| 4 | 15.2 | 24.3 |
| 9 | 7.6 | 26.5 |

| joint area [μm²] | TMR element resistance [Ω] | resistance change rate [%] |
|---:|---:|---:|
| 0.36 | 124.5 | 20.4 |
| 0.64 | 72.1 | 20.8 |
| 1 | 49.5 | 22.7 |
| 4 | 15.6 | 24.8 |
| 9 | 7.6 | 27.2 |

FIG. 30

| joint area [μm²] | TMR element resistance [Ω] | resistance change rate [%] |
|---:|---:|---:|
| 0.36 | 132.0 | 21.0 |
| 0.64 | 76.4 | 21.7 |
| 1 | 50.3 | 23.1 |
| 4 | 16.1 | 25.1 |
| 9 | 7.8 | 27.8 |

FIG. 31

METHODS OF MANUFACTURING A TUNNEL MAGNETORESISTIVE ELEMENT, THIN-FILM MAGNETIC HEAD AND MEMORY ELEMENT

This is a division of application Ser. No. 09/749,582 filed Dec. 28, 2000, now abandoned.

BACKGROUND OF THE INVENTION

1. Field of the Invention

The present invention relates to a tunnel magnetoresistive element utilizing the tunnel magnetoresistive effect, a thin-film magnetic head and a memory element incorporating the tunnel magnetoresistive element, and methods of manufacturing such a tunnel magnetoresistive element, thin-film magnetic head and memory element.

2. Description of the Related Art

Performance improvements in thin-film magnetic heads have been sought as recording density of hard disk drives has increased. Such thin-film magnetic heads include composite thin-film magnetic heads that have been widely used. A composite head is made of a layered structure including a recording head having an induction-type electromagnetic transducer for writing and a reproducing head having a magnetoresistive element for reading.

Reproducing heads that exhibit high sensitivity and produce high outputs have been required. In response to such demands, attention has been focused on tunnel magnetoresistive elements (that may be hereinafter called TMR elements) that detect a magnetic field through the use of the tunnel magnetoresistive effect.

The TMR element has a structure in which a lower magnetic layer, a tunnel barrier layer and an upper magnetic layer are stacked. Each of the lower and upper magnetic layers include a ferromagnetic substance. In general, the magnetic layer closer to the substrate is called the lower magnetic layer and the magnetic layer farther from the substrate is called the upper magnetic layer. Therefore, the terms 'upper' and 'lower' of the upper and lower magnetic layers do not always correspond to the position in the arrangement of an actual TMR element.

The tunnel barrier layer is a layer made of a thin nonmagnetic insulating film through which electrons are capable of passing while maintaining spins thereof by means of the tunnel effect, that is, through which a tunnel current is allowed to pass. The tunnel magnetoresistive effect is a phenomenon that, when a current is fed to a pair of magnetic layers sandwiching the tunnel barrier layer, a tunnel current passing through the tunnel barrier layer changes, depending on the relative angle between magnetizations of the two magnetic layers. If the relative angle between magnetizations of the magnetic layers is small, the tunneling rate is high. As a result, the resistance to the current passing across the magnetic layers is reduced. If the relative angle between magnetizations of the magnetic layers is large, the tunneling rate is low. The resistance to the current passing across the magnetic layers is therefore increased.

As the recording density is increased, a magnetic recording pattern stored on a recording medium is reduced. It is required to reduce the size of a TMR element incorporated in the reproducing head, accordingly. For example, to meet recording density of 40 gigabits per square inch, the size of the TMR element is required to be as small as 0.4 $\mu$m by 0.4 $\mu$m.

Reference is now made to FIG. 36 to FIG. 39 to describe an example of a method of making a small-size TMR element as described above. In this method, as shown in FIG. 36, a lower electrode layer 101 and a film 112 to be the TMR element are formed one by one on a substrate not shown. Next, a fine resist mask 113 using a positive resist is formed by photolithography on the film 112. Next, as shown in FIG. 37, the film 112 is selectively etched through ion milling, for example, using the resist mask 113, to form the TMR element 102. Next, as shown in FIG. 38, an insulating layer 103 is formed around the TMR element 102 to insulate the lower electrode layer 101 from an upper electrode layer described later. Next, as shown in FIG. 39, the resist mask 113 is removed and the upper electrode layer 104 is formed on the TMR element 102.

When the TMR element is formed by etching the film to be the TMR element through ion milling, for example, as described above, a substance separated by etching deposits on sidewalls of the TMR element and a deposition layer is thus formed. As a result, this deposition layer causes a reduction in the properties of the TMR element. Such a problem is caused by a phenomenon called extra current channels, that is, the deposition layer forms channels of extra currents that do not contribute to the tunnel magnetoresistive effect. (See Olivier Redon et al., '44$^{th}$ Annual Conference on Magnetism and Magnetic Materials' AA-11, 1999.) To prevent such a reduction in the TMR element properties, it is desired to avoid formation of a deposition layer if possible when the film to be the TMR element is etched. However, it is impossible in practice that no deposition layer would be formed.

In Published Unexamined Japanese Patent Application Heisei 11-96512 (1999), a technique is disclosed for preventing rust resulting from a deposition layer of a magnetic material formed in the step of ion milling. According to this technique, an insulating protection layer is formed to cover the deposition layer, after etching is completed, in the chamber in which etching has been performed. However, although this technique is utilized for making a TMR element, extra current channels are still formed by the deposition layer. It is therefore impossible to solve the above-mentioned problem.

OBJECT AND SUMMARY OF THE INVENTION

It is an object of the invention to provide a tunnel magnetoresistive element, a thin-film magnetic head and a memory element, and methods of manufacturing the tunnel magnetoresistive element, thin-film magnetic head and memory element for preventing formation of channels of extra currents that would not contribute to the tunnel magnetoresistive effect.

A tunnel magnetoresistive element of the invention comprises a tunnel barrier layer and two magnetic layers sandwiching the tunnel barrier layer. The tunnel barrier layer and at least one of the magnetic layers include sidewalls formed through etching. The tunnel magnetoresistive element further comprises a deposition layer made of a material that is separated through the etching and deposits on the sidewalls and undergoes oxidation or nitriding.

A thin-film magnetic head of the invention incorporates a tunnel magnetoresistive element comprising a tunnel barrier layer and two magnetic layers sandwiching the tunnel barrier layer. The tunnel barrier layer and at least one of the magnetic layers include sidewalls formed through etching. The tunnel magnetoresistive element further comprises a deposition layer made of a material that is separated through the etching and deposits on the sidewalls and undergoes oxidation or nitriding.

A memory element of the invention incorporates a tunnel magnetoresistive element comprising a tunnel barrier layer and two magnetic layers sandwiching the tunnel barrier layer. The tunnel barrier layer and at least one of the magnetic layers include sidewalls formed through etching. The tunnel magnetoresistive element further comprises a deposition layer made of a material that is separated through the etching and deposits on the sidewalls and undergoes oxidation or nitriding.

The tunnel magnetoresistive element, the thin-film magnetic head or the memory element of the invention each comprise the deposition layer made of the material that is separated by etching and deposits on the sidewalls and undergoes oxidation or nitriding. This deposition layer has a high resistance value. It is thereby possible to prevent formation of channels of extra currents that would not contribute to the tunnel magnetoresistive effect.

A method of the invention is provided for manufacturing a tunnel magnetoresistive element comprising a tunnel barrier layer and first and second magnetic layers sandwiching the tunnel barrier layer. The method includes the steps of: forming the first magnetic layer; forming the tunnel barrier layer on the first magnetic layer; forming the second magnetic layer on the tunnel barrier layer; forming sidewalls of at least the second magnetic layer and the tunnel barrier layer by selectively etching these layers; and performing processing for increasing a resistance value of a deposition layer made of a material that is separated through the etching and deposits on the sidewalls.

A method of the invention is provided for manufacturing a thin-film magnetic head incorporating a tunnel magnetoresistive element comprising a tunnel barrier layer and first and second magnetic layers sandwiching the tunnel barrier layer. The method includes the above-described steps.

A method of the invention is provided for manufacturing a memory element incorporating a tunnel magnetoresistive element comprising a tunnel barrier layer and first and second magnetic layers sandwiching the tunnel barrier layer. The method includes the above-described steps.

According to the methods of manufacturing the tunnel magnetoresistive element, the thin-film magnetic head or the memory element of the invention, the resistance value of the deposition layer is increased, the deposition layer being made of the material that is separated through the etching and deposits on the sidewalls. It is thereby possible to prevent formation of channels of extra currents that would not contribute to the tunnel magnetoresistive effect.

According to the methods of manufacturing the tunnel magnetoresistive element, the thin-film magnetic head or the memory element of the invention, the processing for increasing the resistance value of the deposition layer may be oxidation or nitriding of the deposition layer.

Other and further objects, features and advantages of the invention will appear more fully from the following description.

BRIEF DESCRIPTION OF THE DRAWINGS

FIG. 16 is a table showing the result of an experiment performed for determining preferred conditions for the first example of oxidation.

FIG. 17 is a table showing the result of an experiment performed for determining preferred conditions for the first example of oxidation.

FIG. 24 is a table showing the result of an experiment performed for determining preferred conditions for the second example of oxidation.

FIG. 25 is a table showing the result of an experiment performed for determining preferred conditions for the second example of oxidation.

FIG. 30 is a table showing the result of an experiment performed for determining preferred conditions for nitriding of the second embodiment.

FIG. 31 is a table showing the result of an experiment performed for determining preferred conditions for nitriding of the second embodiment.

DETAILED DESCRIPTION OF THE PREFERRED EMBODIMENTS

Preferred embodiments of the invention will now be described in detail with reference to the accompanying drawings.

[First Embodiment]

Figure 1:
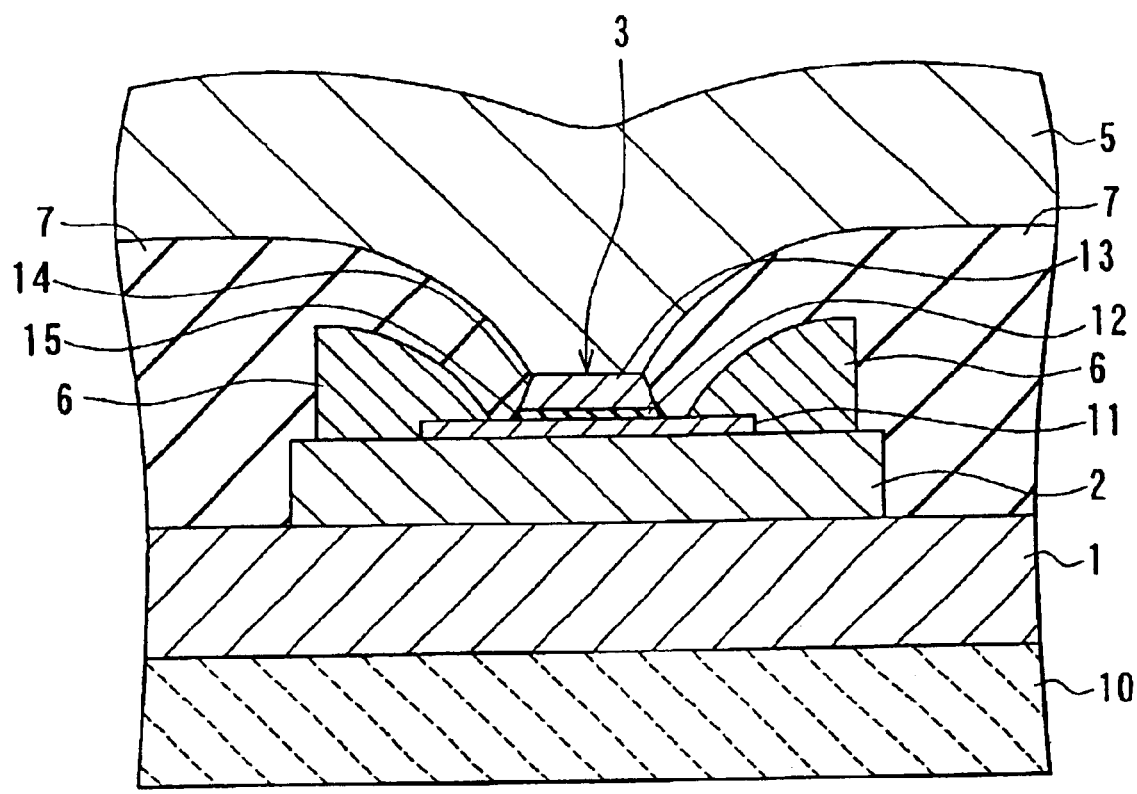
FIG. 1 is a cross section illustrating an example of the configuration of a thin-film magnetic head of a first embodiment of the invention.
Figure 2:
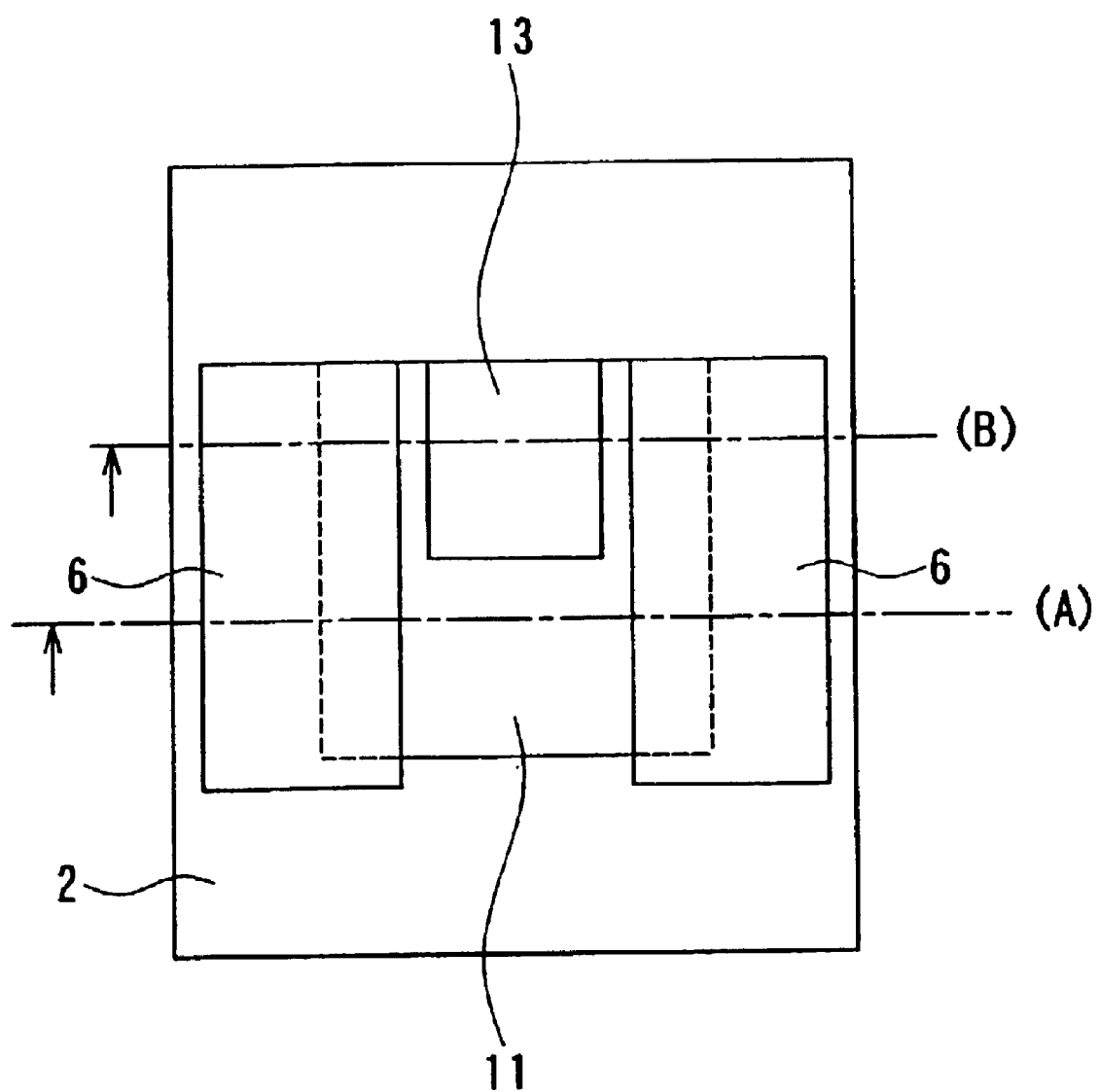
FIG. 2 is a top view of the thin-film magnetic head shown in FIG. 1.

Reference is now made to FIG. 1 and FIG. 2 to describe an example in which configurations of a tunnel magnetoresistive element and a thin-film magnetic head of a first embodiment of the invention are shown. FIG. 1 is a cross section illustrating the configuration of the thin-film magnetic head of this example. FIG. 2 is a top view of the head shown in FIG. 1. FIG. 1 is the cross section parallel to a medium facing surface that faces toward a recording medium. FIG. 2 illustrates the state before the medium facing surface is formed. According to the head of this example, the structure shown in FIG. 2 is polished from the bottom part of FIG. 2 to the level indicated with alternate short and long dash line (A) or (B) to form the medium facing surface.

The thin-film magnetic head of this example functions as a reproducing (read) head that reproduces data magnetically recorded on a recording medium. The thin-film magnetic head comprises: a lower-electrode-cum-lower-shield layer (hereinafter called a lower shield layer) 1 formed on a substrate 10; a lower gap layer 2 formed on the lower shield layer 1; a tunnel magnetoresistive element (hereinafter called a TMR element) 3 of this example formed on the lower gap layer 2; and an upper-electrode-cum-upper-shield layer (hereinafter called an upper shield layer) 5 formed on the TMR element 3. The lower gap layer 2 is made of a nonmagnetic and conductive material, and has functions of preventing leakage of magnetism toward the lower shield layer 1, adjusting the distance between the lower shield layer 1 and the upper shield layer 5, adjusting the position of the TMR element 3, and maintaining the uniformity of tunnel current.

The TMR element 3 includes: a free layer 11, which functions as a first magnetic layer, formed on the lower gap layer 2; a tunnel barrier layer 12 formed on the free layer 11; and a pinned layer 13, which functions as a second magnetic layer, formed on the tunnel barrier layer 12. In this example the tunnel barrier layer 12 and the pinned layer 13 extend over an area smaller than the area of the free layer 11. The free layer 11 contains a ferromagnetic substance and has a direction of magnetization that changes in response to an external magnetic field. The tunnel barrier layer 12 is a layer made of a thin nonmagnetic insulating film through which electrons are capable of passing while maintaining spins thereof by means of the tunnel effect, that is, through which a tunnel current is allowed to pass. The pinned layer 13 contains a ferromagnetic substance and is pinned such that the direction of magnetization is kept constant regardless of an external field.

The thin-film magnetic head of this example further comprises: a pair of hard magnet layers 6 placed on sides of the TMR element 3 on the lower gap layer 2; and an insulating layer 7 that covers the lower shield layer 1, the lower gap layer 2, the hard magnet layers 6 and the free layer 11. The hard magnet layers 6 are provided for applying a bias magnetic field to the TMR element 3 in the horizontal direction of FIG. 1.

The pinned layer 13 and the tunnel barrier layer 12 of the TMR element 3 have sidewalls 14 formed through etching. The TMR element 3 further comprises a deposition layer 15 made of a substance which is separated from the pinned layer 13 and the tunnel barrier layer 12 through etching and deposits on the sidewalls 14 and undergoes oxidation.

Each of the lower shield layer 1 and the upper shield layer 5 is made of at least one layer containing any of NiFe (Permalloy), Sendust, CoFe, and CoFeNi, for example. Each of the lower shield layer 1 and the upper shield layer 5 has a thickness of 0.5 to 4 $\mu$m, or preferably 1 to 3 $\mu$m, for example.

The lower gap layer 2 is made of at least one layer containing any of Cu, Al, Au, Ta, Rh, Cr, In, Ir, Mg, Ru, Ti, W and Zn, for example. The lower gap layer 2 has a thickness of 5 to 70 nm, or preferably 10 to 50 nm, or more preferably 10 to 30 nm, for example.

The free layer 11 is made of at least one layer containing any of Fe, Co, Ni, CoFe, NiFe, CoZrNb and CoFeNi, for example. The free layer 11 has a thickness of 2 to 50 nm, or preferably 4 to 30 nm.

The tunnel barrier layer 12 is made of any of $Al_2O_3$, NiO, GdO, MgO, $Ta_2O_5$, $MoO_2$, $TiO_2$, and $WO_2$, for example. The tunnel barrier layer 12 has a thickness of 0.5 to 2 nm, for example.

The pinned layer 13 is made of at least one layer including any of Fe, Co, Ni, CoFe, NiFe, CoZrNb and CoFeNi, for example. The pinned layer 13 has a thickness of 1 to 10 nm, or preferably 2 to 5 nm. The pinned layer 13 may include a pinning layer for pinning magnetization. This pinning layer is made of an antiferromagnetic material and has a thickness of 6 to 30 nm, for example.

The hard magnet layers 6 are made of a material having high coercive force such as CoPt. The insulating layer 7 is made of an insulating material such as $Al_2O_3$.

The deposition layer 15 is made of a substance which is separated from the pinned layer 13 and the tunnel barrier layer 12 through etching of the layers 13 and 12 and deposits on the sidewalls 14 and undergoes oxidation. Therefore, the deposition layer 15 is mainly made of an oxide of the material forming the pinned layer 13.

Figure 3:
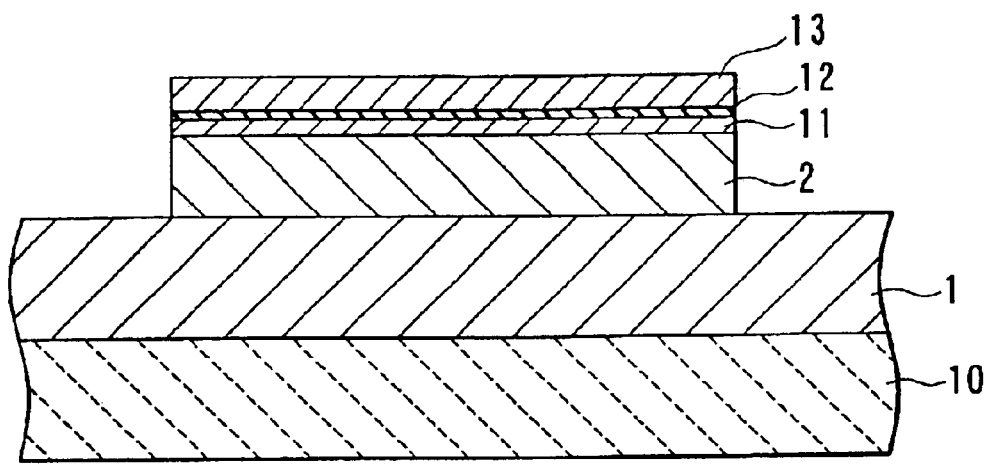
FIG. 3 is a cross section for illustrating a step in a method of manufacturing the thin-film magnetic head shown in FIG. 1.

Reference is now made to FIG. 3 to FIG. 8 to describe the method of manufacturing the thin-film magnetic head shown in FIG. 1. In the manufacturing method, as shown in FIG. 3, the lower shield layer 1 is formed through plating, for example, on the substrate 10. Next, the lower gap layer 2, the free layer 11, the tunnel barrier layer 12 and the pinned layer 13 are formed in this order through sputtering, for example, on the lower shield layer 1.

Figure 4:
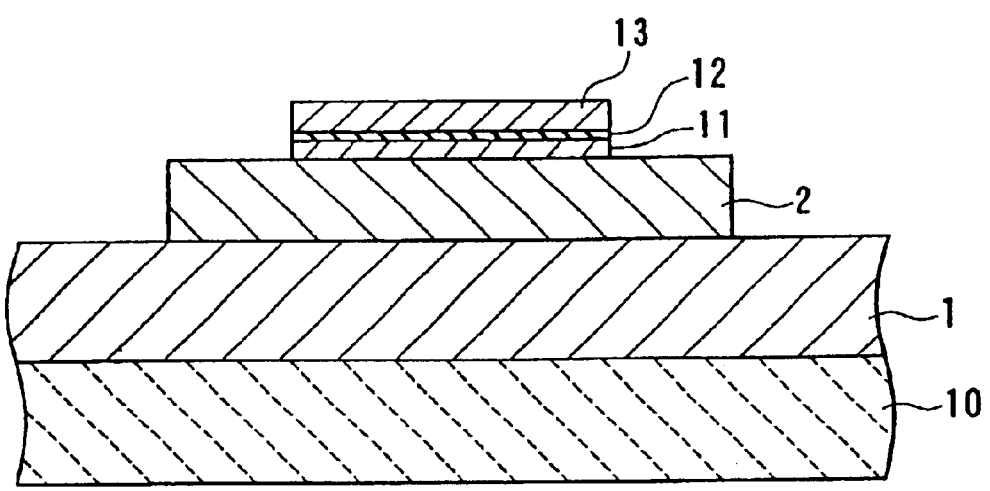
FIG. 4 is a cross section for illustrating a step that follows FIG. 3.

Next, as shown in FIG. 4, the free layer 11, the tunnel barrier layer 12 and the pinned layer 13 are selectively etched through ion milling, for example, to pattern these layers into desired shapes. Alternatively, the free layer 11, the tunnel barrier layer 12 and the pinned layer 13 may be formed into desired shapes through the liftoff method.

Figure 5:
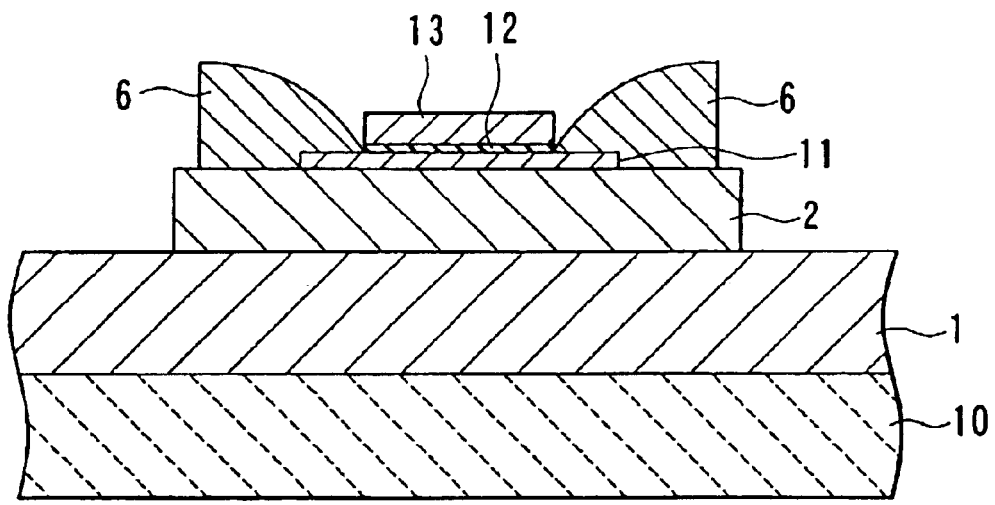
FIG. 5 is a cross section for illustrating a step that follows FIG. 4.

Next, as shown in FIG. 5, the tunnel barrier layer 12 and the pinned layer 13 are selectively etched through ion milling, for example, to expose portions of the free layer 11 near ends thereof. Next, a pair of hard magnet layers 6 are formed through sputtering, for example, to extend from the top of the portions of the free layer 11 exposed to top of the lower gap layer 2.

Figure 6:
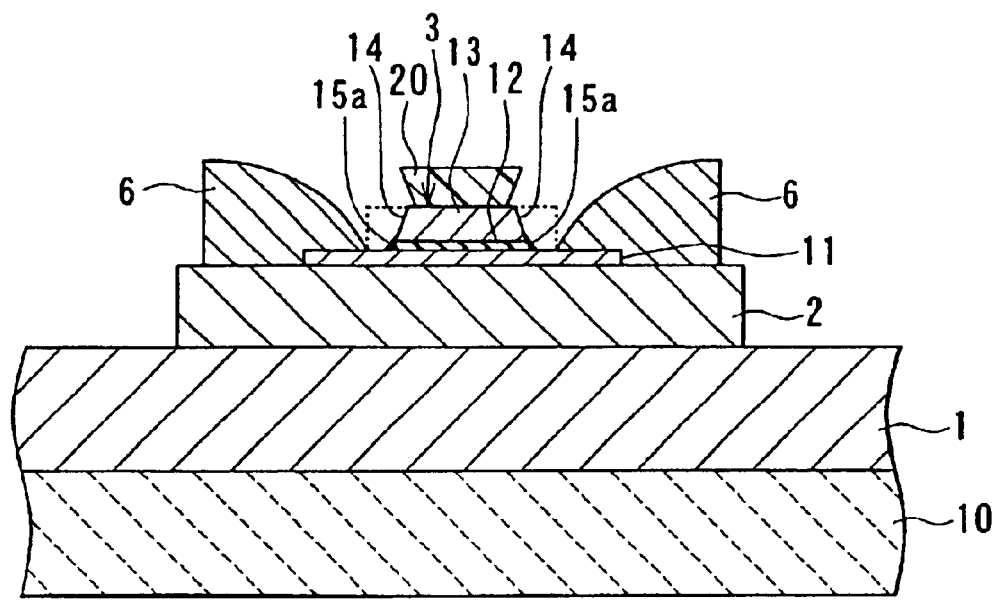
FIG. 6 is a cross section for illustrating a step that follows FIG. 5.

Next, as shown in FIG. 6, a resist mask 20 is formed on the pinned layer 13. The resist mask 20 has a top surface which is smaller than the top surface of the pinned layer 13 in area. Next, the pinned layer 13 and the tunnel barrier layer 12 are selectively etched through ion milling, for example, using the mask 20. Through this etching, the TMR element 3 having a specific shape and made of the free layer 11, the tunnel barrier layer 12 and the pinned layer 13 is formed, and the sidewalls 14 of the pinned layer 13 and the tunnel barrier layer 12 are formed. In addition, the substance separated through etching deposits on the sidewalls 14 and forms deposition layers 15a. The deposition layers 15a are mainly made of the material forming the pinned layer 13 such as Co or CoFe and have conductivity.

Figure 7:
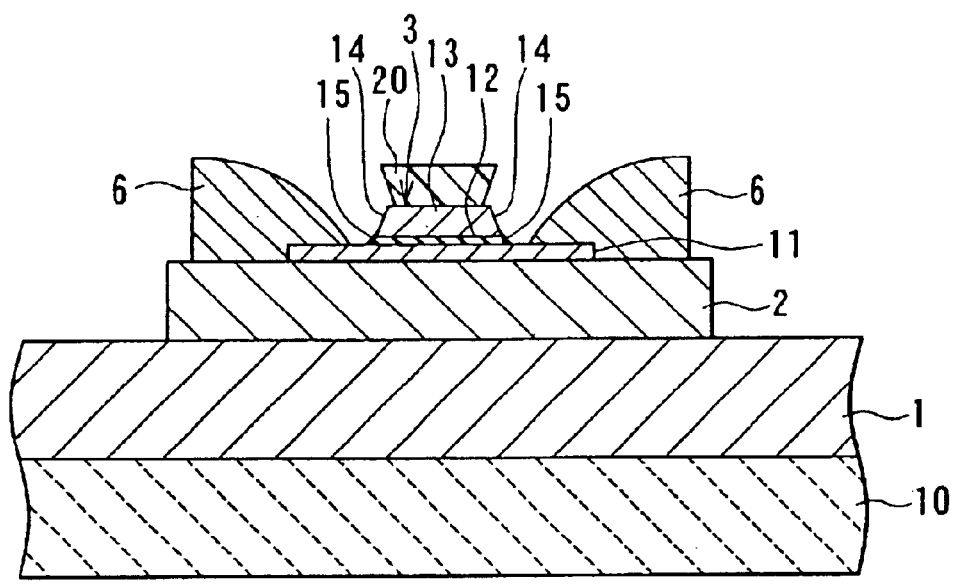
FIG. 7 is a cross section for illustrating a step that follows FIG. 6.

Next, as shown in FIG. 7, oxidation of the deposition layers 15a is performed to increase the resistance value of the deposition layers 15a. Through this oxidation, the deposition layers 15a are made deposition layers 15 of high resistance.

Figure 8:
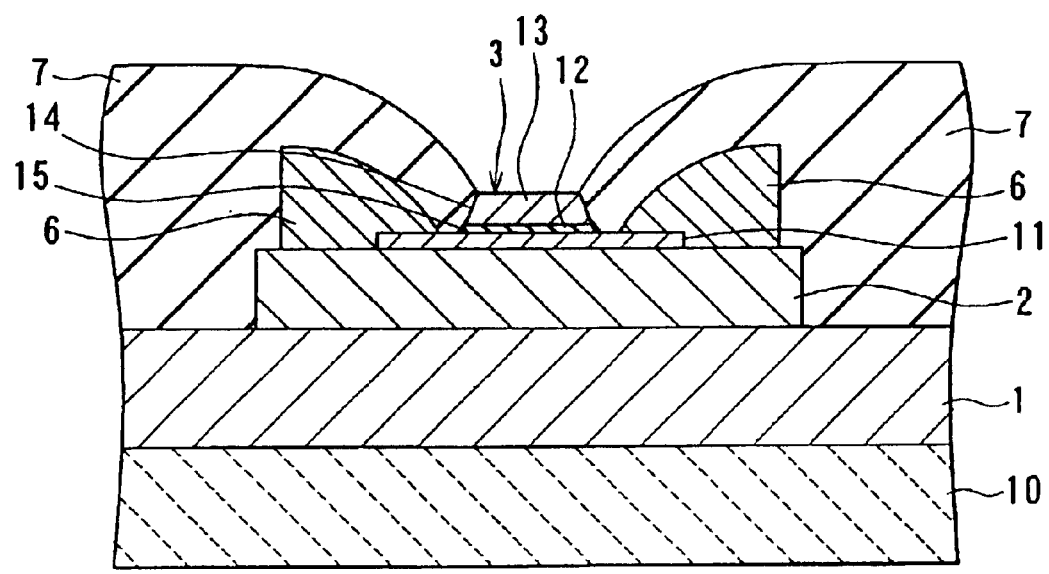
FIG. 8 is a cross section for illustrating a step that follows FIG. 7.

Next, as shown in FIG. 8, the insulating layer 7 is formed through sputtering, for example, to cover the lower shield layer 1, the lower gap layer 2, the hard magnet layers 6, the free layer 11 and the sidewalls 14. The resist mask 20 is then removed.

Next, as shown in FIG. 1, the upper shield layer 5 is formed through plating, for example, on the pinned layer 13 and the insulating layer 7. The thin-film magnetic head is thus completed.

Figure 9:
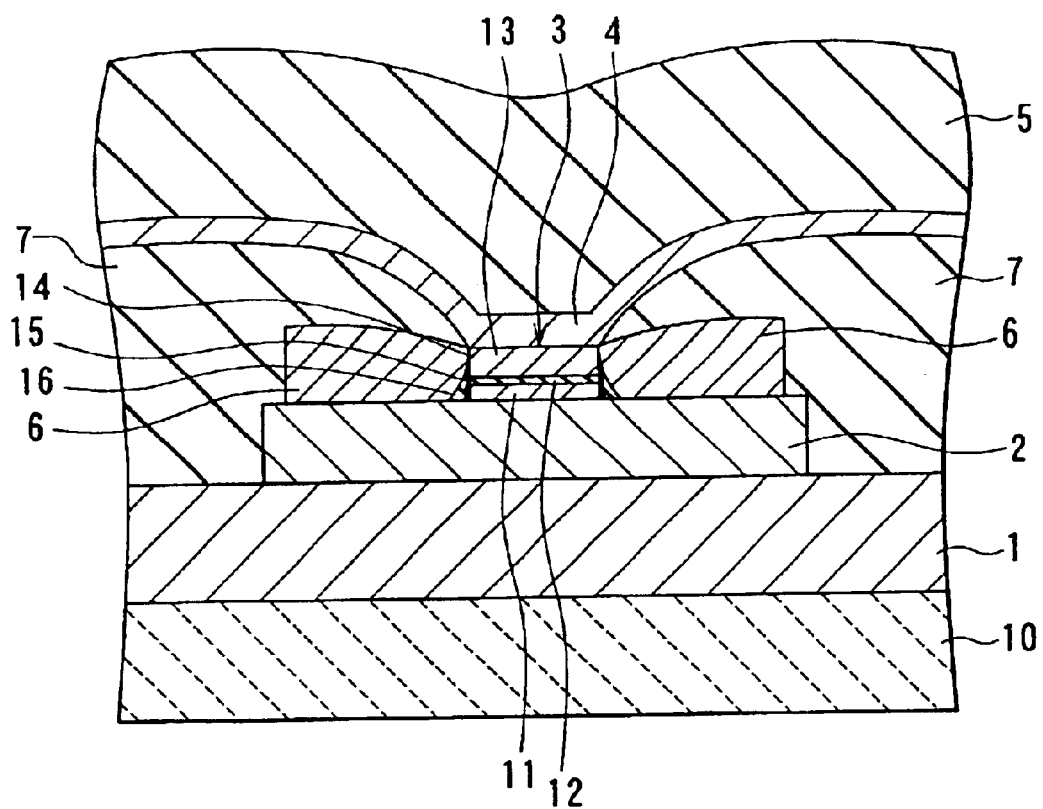
FIG. 9 is a cross section illustrating another example of the configuration of the thin-film magnetic head of the first embodiment of the invention.

Reference is now made to FIG. 9 to describe another example of configurations of the TMR element and thin-film magnetic head of the first embodiment of the invention. FIG. 9 is a cross section illustrating the configuration of the thin-film magnetic head of this example.

The thin-film magnetic head of this example comprises: the lower shield layer 1 formed on the substrate 10; the lower gap layer 2 formed on the lower shield layer 1; the TMR element 3 of this example formed on the lower gap layer 2; an upper gap layer 4 formed on the TMR element 3; and the upper shield layer 5 formed on the upper gap layer 4. The upper gap layer 4 is made of a nonmagnetic and conductive material. The upper gap layer 4 has functions of preventing leakage of magnetism toward the upper shield layer 5, adjusting the distance between the lower shield layer 1 and the upper shield layer 5, adjusting the position of the TMR element 3, and maintaining the uniformity of tunnel current.

The TMR element 3 includes: the free layer 11, which functions as the first magnetic layer, formed on the lower gap layer 2; the tunnel barrier layer 12 formed on the free layer 11; and the pinned layer 13, which functions as the second magnetic layer, formed on the tunnel barrier layer 12. In this example the free layer 11, the tunnel barrier layer 12 and the pinned layer 13 have plane geometries nearly similar to one another.

The thin-film magnetic head of this example further comprises: a p air of hard magnet layers 6 placed on the sides of the TMR element 3 on the lower gap layer 2; and the insulating layer 7 that covers the lower shield layer 1, the lower gap layer 2 and the hard magnet layers 6.

The pinned layer 13, the tunnel barrier layer 12 and the free layer 11 of the TMR element 3 have the sidewalls 14 formed through etching. The TMR element 3 further comprises: the deposition layers 15 made of a substance which is separated through etching and deposits on the sidewalls 14 and undergoes oxidation; and an insulating layer 16 that covers the sidewalls 14 and the deposition layers 15.

The upper gap layer 4 is made of at least one layer containing any of Cu, Al, Au, Ta, Rh, Cr, In, Ir, Mg, Ru, Ti, W and Zn, for example. The upper gap layer 4 has a thickness of 5 to 70 nm, or preferably 10 to 50 nm, or more preferably 10 to 30 nm, for example. The insulating layer 16 is made of an insulating material such as $Al_2O_3$.

The remainder of configuration of the thin-film magnetic head shown in FIG. 9 is similar to that of the head shown in FIG. 1.

Figure 10:
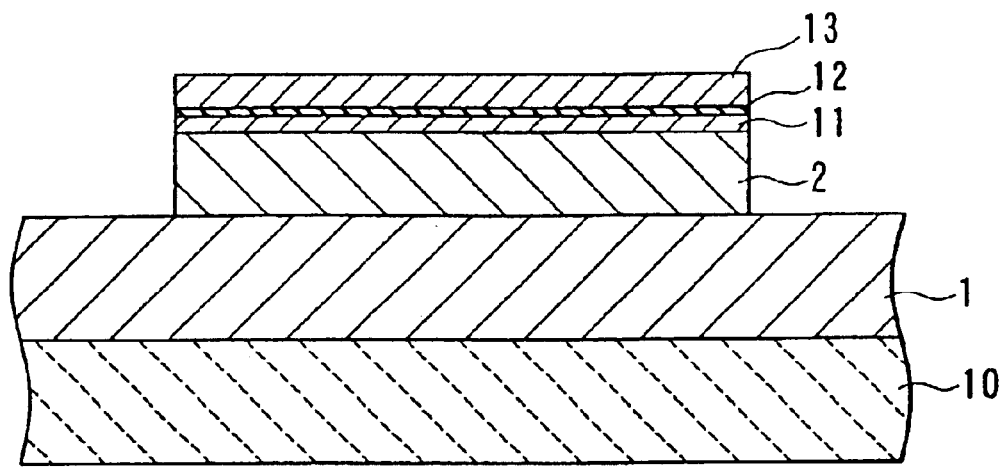
FIG. 10 is a cross section for illustrating a step in a method of manufacturing the thin-film magnetic head shown in FIG. 9.

Reference is now made to FIG. 10 to FIG. 14 to describe the method of manufacturing the thin-film magnetic head shown in FIG. 9. In the manufacturing method, as shown in FIG. 10, the lower shield layer 1 is formed through plating, for example, on the substrate 10. Next, the lower gap layer 2, the free layer 11, the tunnel barrier layer 12 and the pinned layer 13 are formed in this order through sputtering, for example, on the lower shield layer 1. Alternatively, the liftoff method may be employed to form the free layer 11, the tunnel barrier layer 12 and the pinned layer 13 into specific shapes.

Figure 11:
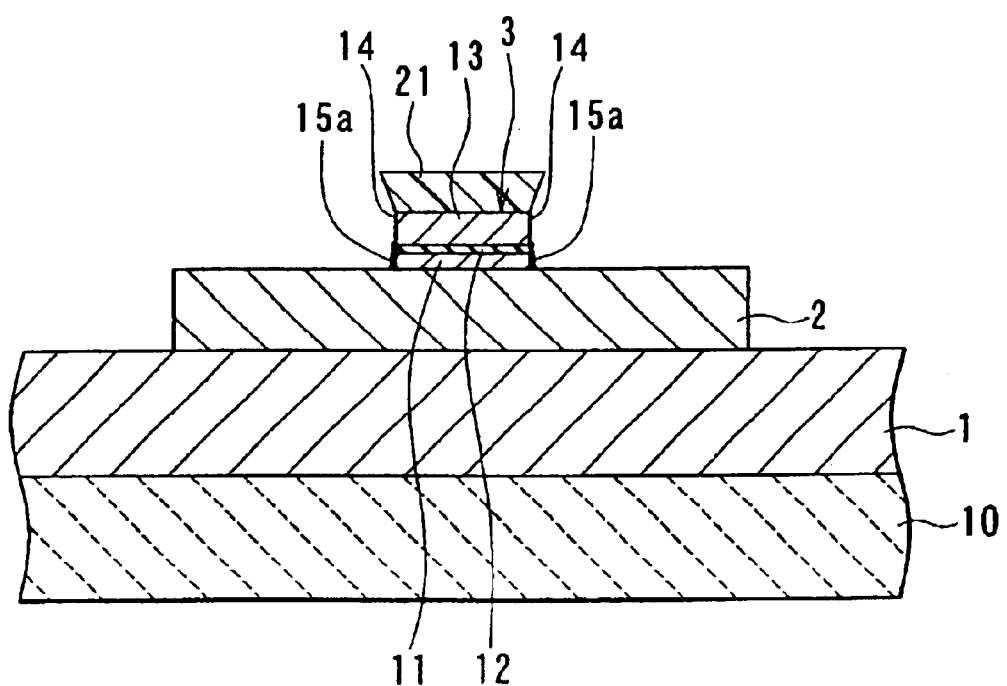
FIG. 11 is a cross section for illustrating a step that follows FIG. 10.

Next, as shown in FIG. 11, the resist mask 21 having a specific shape is formed on the pinned layer 13. The pinned layer 13, the tunnel barrier layer 12 and the free layer 11 are selectively etched through ion milling, for example, using the resist mask 21. At the same time, the lower gap layer 2 is also etched to some extent. Through this etching, the TMR element 3 having a specific shape and made of the free layer 11, the tunnel barrier layer 12 and the pinned layer 13 is formed, and the sidewalls 14 of the pinned layer 13, the tunnel barrier layer 12 and the free layer 11 are formed. In addition, the substance separated through etching deposits on the sidewalls 14 and forms the deposition layers 15a. The deposition layers 15a are mainly made of the material forming the lower gap layer 2 such as Ta, Al or Rh and have conductivity.

Figure 12:
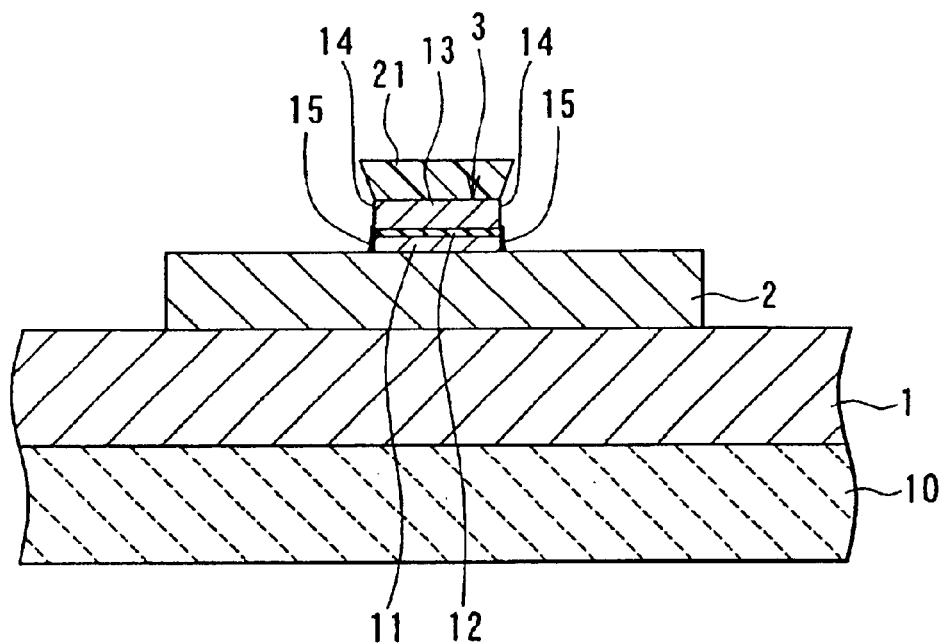
FIG. 12 is a cross section for illustrating a step that follows FIG. 11.

Next, as shown in FIG. 12, oxidation of the deposition layers 15a is performed to increase the resistance value of the deposition layers 15a. Through this oxidation, the deposition layers 15a are made deposition layers 15 of high resistance.

Figure 13:
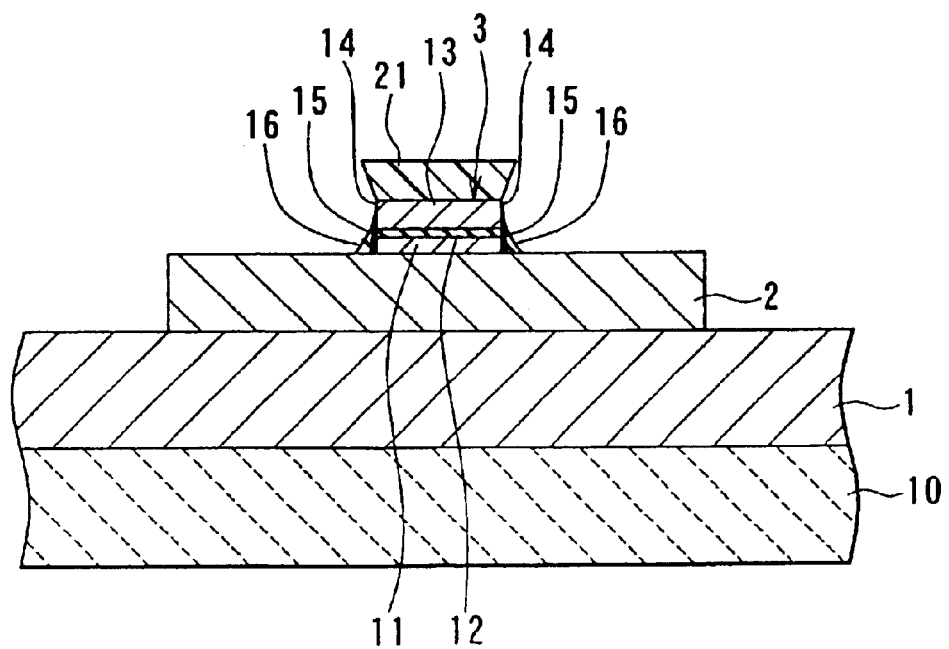
FIG. 13 is a cross section for illustrating a step that follows FIG. 12.

Next, as shown in FIG. 13, a thin insulating layer 16 is formed through sputtering, for example, to cover the sidewalls 14 and the deposition layers 15.

Figures 14, 15:
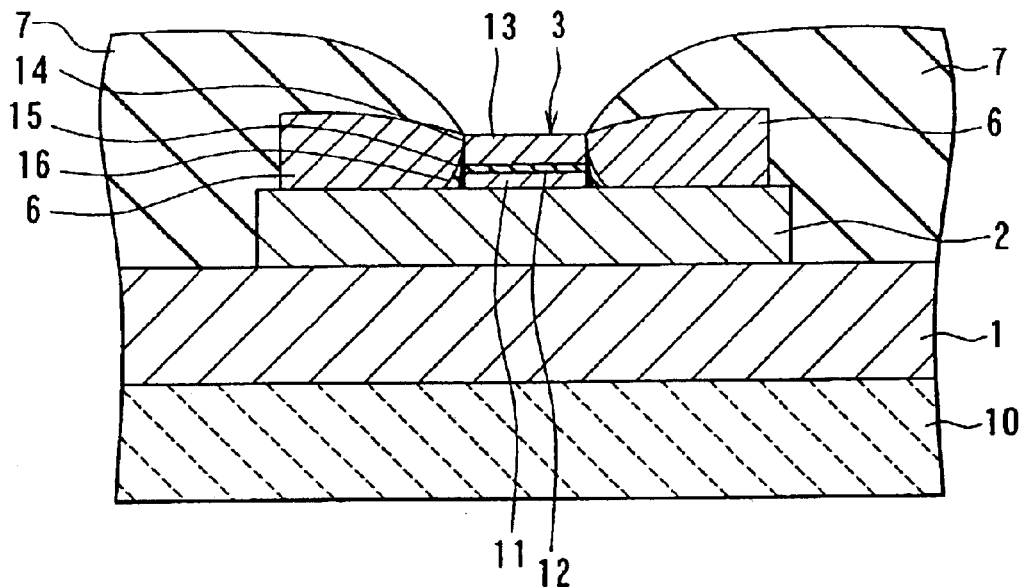
FIG. 14 is a cross section for illustrating a step that follows FIG. 13.
FIG. 15 is a table showing the result of an experiment performed for determining preferred conditions for a first example of oxidation.

Next, as shown in FIG. 14, the hard magnet layers 6 are formed through sputtering, for example, on the lower gap layer 2. The insulating layer 7 is then formed through sputtering, for example, to cover the lower shield layer 1, the lower gap layer 2, and the hard magnet layers 6. The resist mask 21 is then removed.

Next, as shown in FIG. 9, the upper gap layer 4 is formed through sputtering, for example, on the pinned layer 13 and the insulating layer 7. Finally, the upper shield layer 5 is formed through plating, for example, on the upper gap layer 4. The thin-film magnetic head is thus completed. In the structure shown in FIG. 9, the positions of the free layer 11 and the pinned layer 13 may be reversed.

The following are descriptions of two specific examples of oxidation of the deposition layers and preferred conditions for each of the examples of this embodiment. The first example of oxidation is to oxidize the deposition layers by exposing the structure to the atmosphere after the TMR element is formed through ion milling. The second example is to oxidize the deposition layers in an oxygen atmosphere after the TMR element is formed through ion milling.

Reference is now made to FIG. 15 to FIG. 22 to describe experiments performed to determine preferable conditions for the first example of oxidation. Elements having the following structure were used for this experiment. Each of the elements had a lower electrode layer made up of three layers of a Ta layer having a thickness of 5 nm, a Cu layer having a thickness of 50 nm, and a Ta layer having a thickness of 5 nm. On the lower electrode layer, the following layers were stacked one by one: a free layer made up of two layers of a NiFe layer having a thickness of 3 nm and a CoFe layer having a thickness of 3 nm; a tunnel barrier layer; a pinned layer made up of two layers of a CoFe layer having a thickness of 3 nm and a PtMn layer having a thickness of 17 nm; and an upper electrode layer made up of two layers of a Cu layer having a thickness of 50 nm and a Ta layer having a thickness of 5 nm. The tunnel barrier layer was formed by making an Al layer having a thickness of 0.7 nm and oxidizing the Al layer in an oxygen atmosphere at 200 Torr (26664.4 Pa) for one hour.

In this experiment five types of elements were used. In these elements the areas of the free layer, the tunnel barrier layer and the pinned layer joined to each other are: $0.36\ \mu m^2$ ($0.6\ \mu m$ by $0.6\ \mu m$); $0.64\ \mu m^2$ ($0.8\ \mu m$ by $0.8\ \mu m$); $1\ \mu m^2$ ($1\ \mu m$ by $1\ \mu m$); $4\ \mu m^2$ ($2\ \mu m$ by $2\ \mu m$); $9\ \mu m^2$ ($3\ \mu m$ by $3\ \mu m$); respectively.

FIG. 15 shows the relationship among the above-described joint areas, the resistance values of the TMR elements, and the maximum rates of changes in the resistance values of the TMR elements (simply shown as resistance change rate in the table) when the insulating layer covering the sidewalls of each of the TMR elements were formed immediately after the TMR element had been formed through ion milling without performing oxidation. The resistance change rate was obtained from an amount of change in the resistance value of the TMR element when an external magnetic field was changed, the amount of change being divided by a minimum resistance value and being indicated in percent.

FIG. 16 shows the relationship among the above-described joint areas, the resistance values of the TMR elements, and the maximum rates of changes in the resistance values of the TMR elements when each of the TMR elements was formed through ion milling and then exposed to the atmosphere for one minute.

FIG. 17 shows the relationship among the joint areas, the resistance values of the TMR elements, and the maximum rates of changes in the resistance values of the TMR elements when each of the TMR elements was formed through ion milling and then exposed to the atmosphere for 60 minutes.

Figures 18, 19:
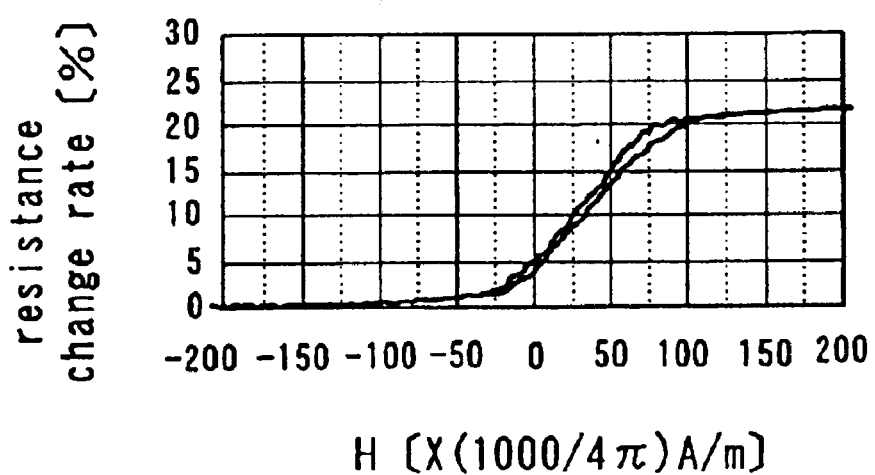
FIG. 18 is a table showing the result of an experiment performed for determining preferred conditions for the first example of oxidation.
FIG. 19 is a plot showing the result of an experiment performed for determining preferred conditions for the first example of oxidation.

FIG. 18 shows the relationship among the joint areas, the resistance values of the TMR elements, and the maximum rates of changes in the resistance values of the TMR elements when each of the TMR elements was formed through ion milling and then exposed to the atmosphere for 48 hours.

FIG. 19 illustrates the hysteresis loop of the TMR element, whose joint area was $1\ \mu m^2$, indicated as the relationship between the rate of change in resistance of the element and external field H being varied, when no oxidation was performed after the element had been formed through ion milling.

Figure 20:
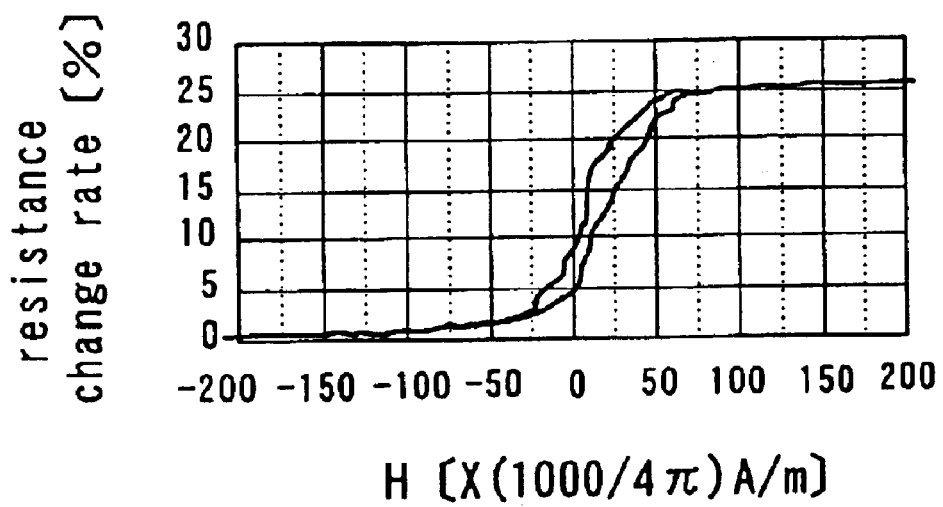
FIG. 20 is a plot showing the result of an experiment performed for determining preferred conditions for the first example of oxidation.

FIG. 20 illustrates the hysteresis loop of the TMR element, whose joint area was $1\ \mu m^2$, indicated as the relationship between the rate of change in resistance of the element and external field H being varied, when the element was formed through ion milling and then exposed to the atmosphere for one minute.

Figure 21:
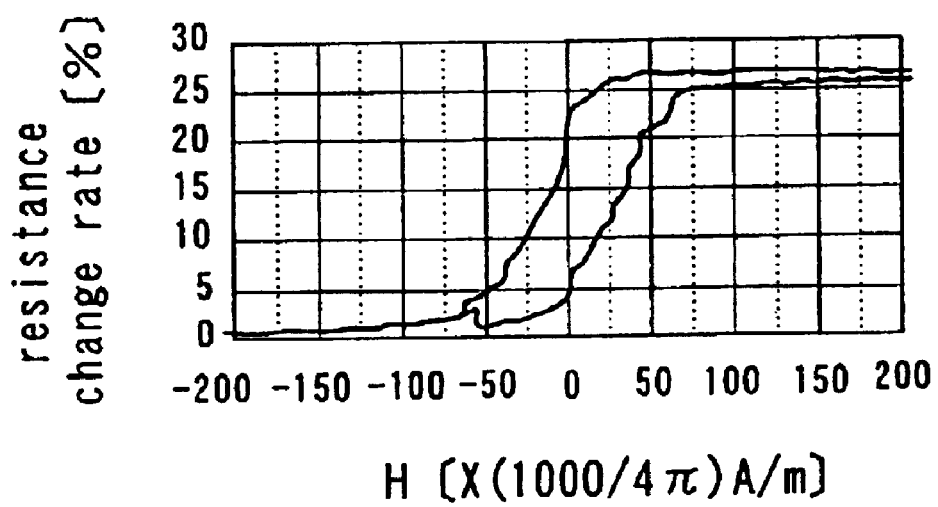
FIG. 21 is a plot showing the result of an experiment performed for determining preferred conditions for the first example of oxidation.

FIG. 21 illustrates the hysteresis loop of the TMR element, whose joint area was $1\ \mu m^2$, indicated as the relationship between the rate of change in resistance of the element and external field H being varied, when the element was formed through ion milling and then exposed to the atmosphere for 60 minutes.

Figures 22, 23:
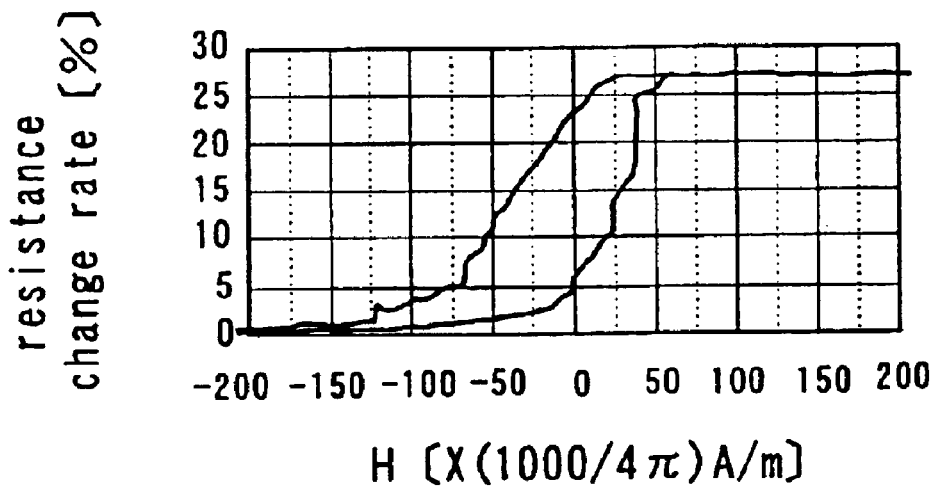
FIG. 22 is a plot showing the result of an experiment performed for determining preferred conditions for the first example of oxidation.
FIG. 23 is a table showing the result of an experiment performed for determining preferred conditions for a second example of oxidation.

FIG. 22 illustrates the hysteresis loop of the TMR element, whose joint area was $1\ \mu m^2$, indicated as the relationship between the rate of change in resistance of the element and external field H being varied, when the element was formed through ion milling and then exposed to the atmosphere for 48 hours.

According to FIG. 15 to FIG. 18, if the TMR element was exposed to the atmosphere for one minute or longer, both of the resistance of the element and the maximum rate of change in resistance thereof increased and the characteristics of the element were improved, compared to the case in which no oxidation was performed. According to FIG. 15 to FIG. 18, both of the resistance of the element and the maximum rate of change in resistance thereof increased as the element was exposed to the atmosphere for a longer period. According to FIG. 19 to FIG. 22, the gap in hysteresis loop increased as the element was exposed to the atmosphere for a longer period. The gap in hysteresis loop corresponded to the coercive force of the TMR element. It is undesired that the gap in hysteresis loop exceeded the gap obtained in the case shown in FIG. 22 when the exposure to the atmosphere was for 48 hours. Therefore, the period of exposure to the atmosphere is preferably in the range of one minute and 48 hours inclusive.

Reference is now made to FIG. 23 to FIG. 28 to describe experiments performed to determine preferable conditions for the second example of oxidation. The elements used for this experiment were similar to the ones used in the first example.

FIG. 23 shows the relationship among the joint areas, the resistance values of the TMR elements, and the maximum rates of changes in the resistance values of the TMR elements, when each of the TMR elements was formed through ion milling and then oxidation was performed in an oxygen atmosphere at 200 Torr (26664.4 Pa) for one minute.

FIG. 24 shows the relationship among the joint areas, the resistance values of the TMR elements, and the maximum rates of changes in the resistance values of the TMR elements when each of the TMR elements was formed through ion milling and then oxidation was performed in the abovementioned oxygen atmosphere for 60 minutes.

FIG. 25 shows the relationship among the joint areas, the resistance values of the TMR elements, and the maximum rates of changes in the resistance values of the TMR elements when each of the TMR elements was formed through ion milling and then oxidation was performed in the abovementioned oxygen atmosphere for 48 hours.

Figure 26:
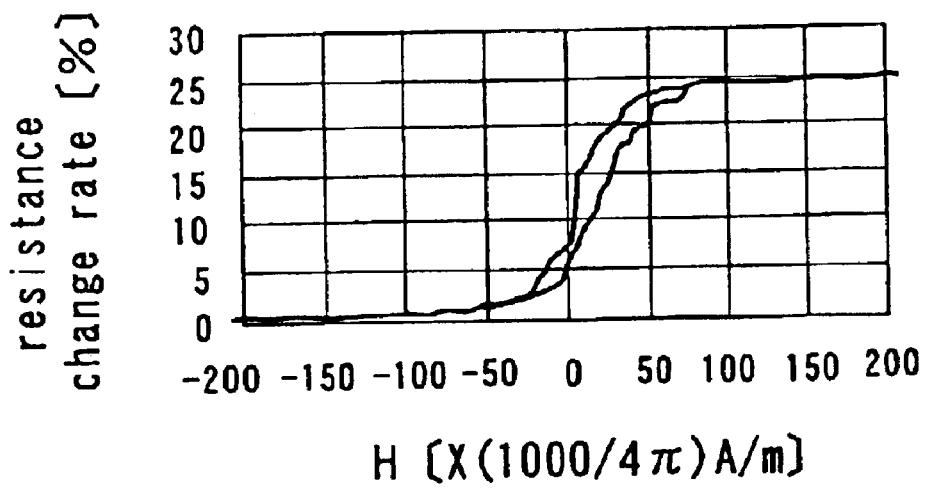
FIG. 26 is a plot showing the result of an experiment performed for determining preferred conditions for the second example of oxidation.

FIG. 26 illustrates the hysteresis loop of the TMR element, whose joint area was 1 $\mu m^2$, indicated as the relationship between the rate of change in resistance of the element and external field H being varied, when the element was formed through ion milling and then the abovementioned oxidation was performed for one minute.

Figure 27:
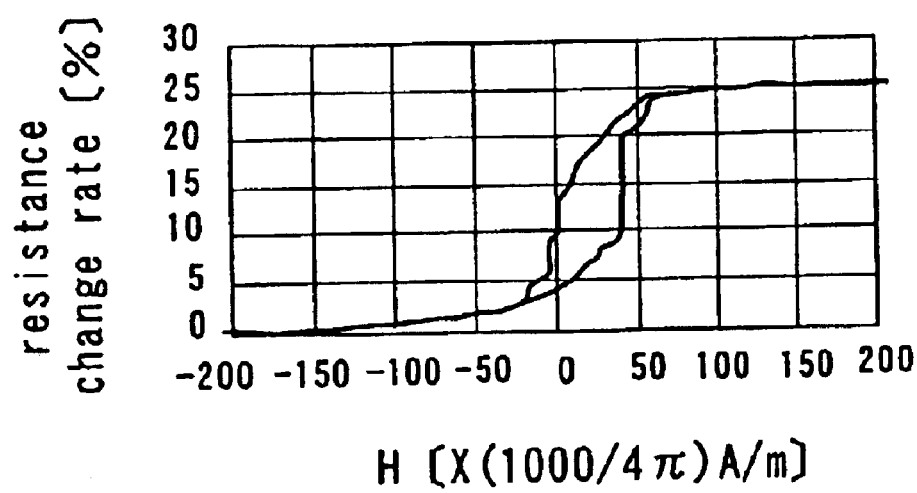
FIG. 27 is a plot showing the result of an experiment performed for determining preferred conditions for the second example of oxidation.

FIG. 27 illustrates the hysteresis loop of the TMR element, whose joint area was 1 $\mu m^2$, indicated as the relationship between the rate of change in resistance of the element and external field H being varied, when the element was formed through ion milling and then the abovementioned oxidation was performed for 60 minutes.

Figures 28, 29:
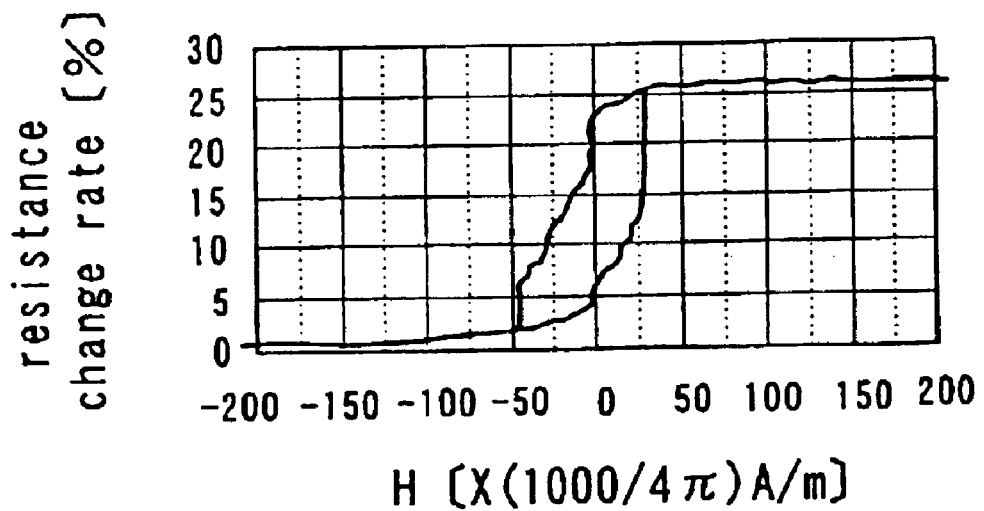
FIG. 28 is a plot showing the result of an experiment performed for determining preferred conditions for the second example of oxidation.
FIG. 29 is a table showing the result of an experiment performed for determining preferred conditions for nitriding of a second embodiment of the invention.

FIG. 28 illustrates the hysteresis loop of the TMR element, whose joint area was 1 $\mu m^2$, indicated as the relationship between the rate of change in resistance of the element and external field H being varied, when the element was formed through ion milling and then the abovementioned oxidation was performed for 48 hours.

According to FIG. 15 and FIG. 23 to FIG. 25, if the oxidation in an oxygen atmosphere was performed for one minute or longer, both of the resistance of the element and the maximum rate of change in resistance thereof increased and the characteristics of the element were improved, compared to the case in which no oxidation was performed. According to FIG. 15 and FIG. 23 to FIG. 25, both of the resistance of the element and the maximum rate of change in resistance thereof increased as the oxidation in the oxygen atmosphere was performed for a longer period. According to FIG. 19 and FIG. 26 to FIG. 28, the gap in hysteresis loop increased as the oxidation in the oxygen atmosphere was performed for a longer period. It is undesired that the gap in hysteresis loop exceeded the gap obtained in the case shown in FIG. 28 when the oxidation was performed for 48 hours. Therefore, the period of oxidation in the oxygen atmosphere is preferably in the range of one minute and 48 hours inclusive.

According to the embodiment described so far, when the TMR element is formed by etching a film to be the element through ion milling, for example, oxidation is performed on the deposition layers made of the material that is separated through etching and deposits on the sidewalls of the TMR element. The resistance value of the deposition layer is increased by this oxidation It is thereby possible to prevent formation of channels of extra currents that would not contribute to the tunnel magnetoresistive effect. This embodiment thus achieves the TMR element and thin-film magnetic head capable of producing high outputs.

[Second Embodiment]

A second embodiment of the invention will now be described. A TMR element and a thin-film magnetic head of this embodiment are similar to those of the first embodiment except that the deposition layers are replaced with deposition layers made of a material that is separated through etching and deposits on the sidewalls and undergoes nitriding. A method of manufacturing the TMR element and a method of manufacturing the thin-film magnetic head of the second embodiment include nitriding to increase the resistance value of the deposition layers, in place of the oxidation of the first embodiment.

Reference is now made to FIG. 29 to FIG. 34 to describe experiments performed to determine preferable conditions for nitriding of the second embodiment. The elements used for this experiment were similar to the ones used in the experiments of the first embodiment.

FIG. 29 shows the relationship among the joint areas, the resistance values of the TMR elements, and the maximum rates of changes in the resistance values of the TMR elements, when each of the TMR elements was formed through ion milling and then nitriding was performed in an nitrogen atmosphere at 200 Torr (26664.4 Pa) for one minute.

FIG. 30 shows the relationship among the joint areas, the resistance values of the TMR elements, and the maximum rates of changes in the resistance values of the TMR elements when each of the TMR elements was formed through ion milling and then nitriding was performed in the abovementioned nitrogen atmosphere for 60 minutes.

FIG. 31 shows the relationship among the joint areas, the resistance values of the TMR elements, and the maximum rates of changes in the resistance values of the TMR elements when each of the TMR elements was formed through ion milling and then nitriding was performed in the abovementioned nitrogen atmosphere for 48 hours.

Figure 32:
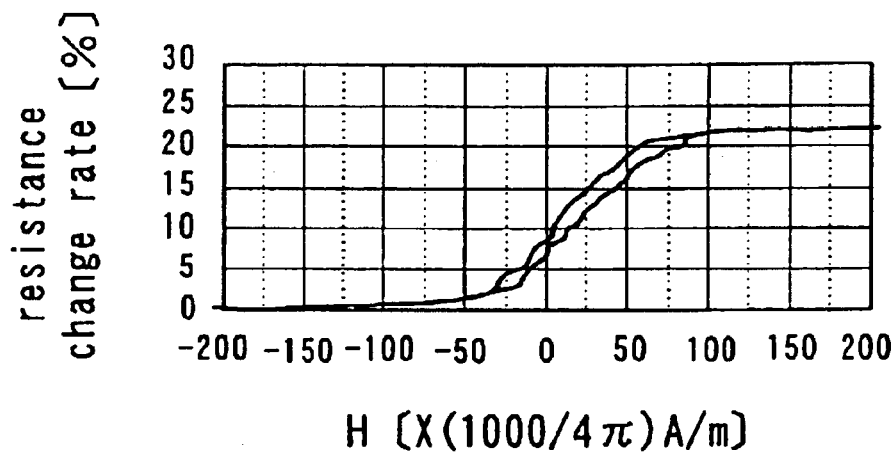
FIG. 32 is a plot showing the result of an experiment performed for determining preferred conditions for nitriding of the second embodiment.

FIG. 32 illustrates the hysteresis loop of the TMR element, whose joint area was 1 $\mu m^2$, indicated as the relationship between the rate of change in resistance of the element and external field H being varied, when the element was formed through ion milling and then the abovementioned nitriding was performed for one minute.

Figure 33:
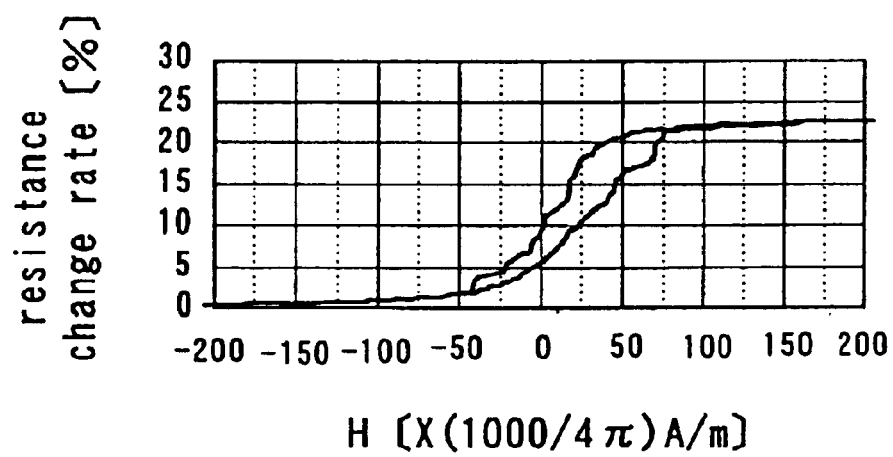
FIG. 33 is a plot showing the result of an experiment performed for determining preferred conditions for nitriding of the second embodiment.

FIG. 33 illustrates the hysteresis loop of the TMR element, whose joint area was 1 $\mu m^2$, indicated as the relationship between the rate of change in resistance of the element and external field H being varied, when the element was formed through ion milling and then the abovementioned nitriding was performed for 60 minutes.

Figure 34:
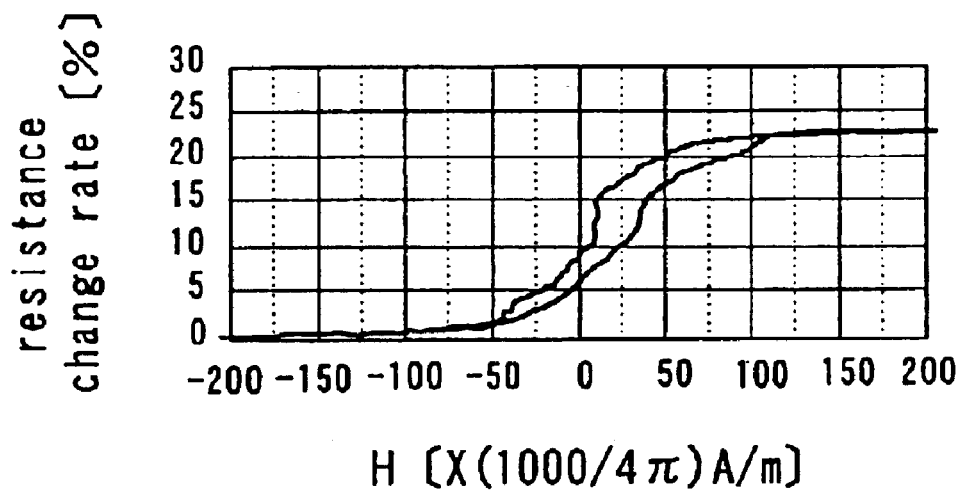
FIG. 34 is a plot showing the result of an experiment performed for determining preferred conditions for nitriding of the second embodiment.

FIG. 34 illustrates the hysteresis loop of the TMR element, whose joint area was 1 $\mu m^2$, indicated as the relationship between the rate of change in resistance of the element and external field H being varied, when the element was formed through ion milling and then the abovementioned nitriding was performed for 48 hours.

When the insulating layer covering the sidewalls of each of the TMR elements was formed immediately after the TMR element had been formed through ion milling without performing nitriding, the relationship among the joint areas, the resistance values of the TMR elements, and the maximum rates of changes in the resistance values of the TMR elements was similar to the one shown in FIG. 15. When no nitriding was performed after the TMR element had been formed through ion milling, the hysteresis loop of the TMR element, whose joint area was 1 $\mu m^2$, indicated as the relationship between the rate of change in resistance of the element and external field H being varied, was similar to the one shown in FIG. 19.

According to FIG. 15 and FIG. 29 to FIG. 31, if the nitriding in the nitrogen atmosphere was performed for one minute or longer, both of the resistance of the element and the maximum rate of change in resistance thereof increased and the characteristics of the element were improved, compared to the case in which no nitriding was performed. According to FIG. 15 and FIG. 29 to FIG. 31, both of the resistance of the element and the maximum rate of change in resistance thereof increased as the nitriding in the nitrogen atmosphere was performed for a longer period. According to FIG. 19 and FIG. 32 to FIG. 34, the gap in hysteresis loop increased as the nitriding in the nitrogen atmosphere was performed for a longer period. However, the gap in hysteresis loop obtained when the nitriding was performed was smaller than the gap obtained when the oxidation was performed. According to the experiments, the characteristics of the TMR element were improved when the period of nitriding in the nitrogen atmosphere was at least in the range of one minute and 48 hours inclusive.

The remainder of configuration, functions and effects of the second embodiment are similar to those of the first embodiment.

[Third Embodiment]

Figure 35:
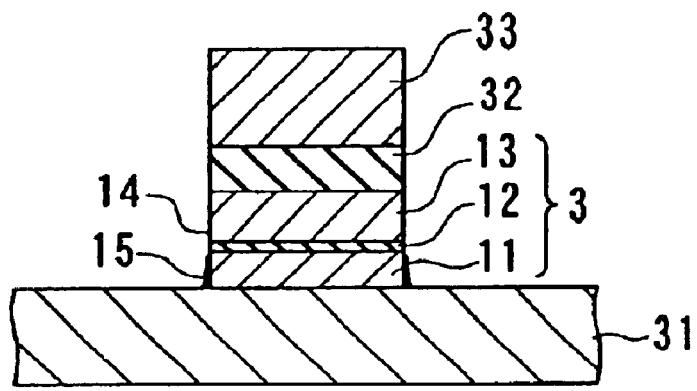
FIG. 35 is a cross section illustrating the configuration of a memory element of a third embodiment of the invention.
Figure 36:
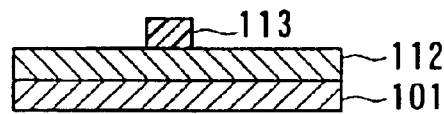
FIG. 36 is a cross section for illustrating an example of a method of fabricating a TMR element.
Figure 37:
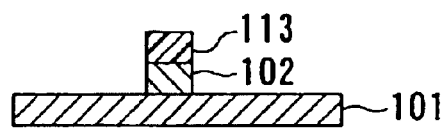
FIG. 37 is a cross section for illustrating the example of the method of fabricating the TMR element.
Figure 38:
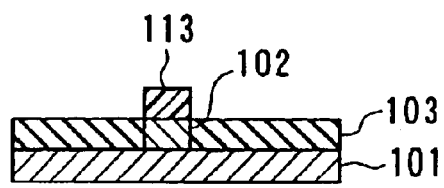
FIG. 38 is a cross section for illustrating the example of the method of fabricating the TMR element.
Figure 39:
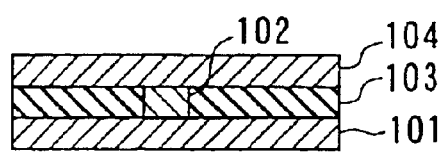
FIG. 39 is a cross section for illustrating the example of the method of fabricating the TMR element.

A memory element and a method of manufacturing the same of a third embodiment of the invention will now be described. FIG. 35 is a cross section illustrating the configuration of the memory element of the embodiment. The memory element makes up each of memory cells of a nonvolatile magnetic random access memory (hereinafter called MRAM). The MRAM comprises a plurality of bit lines 31 and a plurality of word lines 33 arranged in a matrix. Each of the memory cells of the MRAM, that is, the memory element of this embodiment comprises the TMR element 3 located between one of the bit lines 31 and one of the word lines 33 at the intersection thereof.

The TMR element 3 of the embodiment includes the free layer 11, the tunnel barrier layer 12 and the pinned layer 13 stacked, as the element 3 of the first embodiment. In the third embodiment the TMR element 3 is placed such that the free layer 11 touches the bit line 31. An insulating layer 32 is provided between the pinned layer 13 and the word line 33.

The TMR element 3 has the sidewalls 14 formed through etching. The TMR element 3 further has the deposition layers 15 made of the material that is separated through etching and deposits on the sidewalls 14 and undergoes oxidation or nitriding.

The memory element of the embodiment is fabricated through stacking the bit line 31, the TMR element 3, the insulating layer 32 and the word line 33 one by one on a substrate not shown, using semiconductor manufacturing techniques. The TMR element 3 is formed by selectively etching a film to be the element through ion milling, for example, as in the first embodiment. The deposition layers 15 are formed by performing oxidation as that of the first embodiment or nitriding as that of the second embodiment on the deposition layers made of the material that is separated through etching and deposits on the sidewalls 14 of the TMR element 3.

The function of the memory element of the embodiment will now be described. In this memory element the free layer 11 of the TMR element 3 functions as a storage layer in which data is stored. Storage of data is performed by reversing the magnetization (spin) of the free layer 11 through the use of the composite magnetic field generated by the current flowing through the bit line 31 and the current flowing through the word line 33 Reading of data is performed by determining the difference in the state of magnetization (spin) of the free layer 11 through the use of the tunnel magnetoresistive effect of the TMR element 3.

According to the embodiment, it is possible to prevent formation of channels of extra currents that would not contribute to the tunnel magnetoresistive effect. The TMR element 3 capable of producing high outputs is thus obtained. As a result, the high-performance memory element and MRAM are obtained.

The remainder of configuration, functions and effects of the third embodiment are similar to those of the first or second embodiment.

The present invention is not limited to the foregoing embodiments but may be practiced in still other ways. For example, although the thin-film magnetic head that functions as a reproducing head is disclosed in the first and second embodiments, the invention is applicable to a composite thin-film magnetic head made up of layers of a reproducing head utilizing the TMR element and a recording head incorporating an induction-type electromagnetic transducer for writing.

The configurations of the TMR element and the thin-film magnetic head of the first embodiment and the configurations of the TMR element and the memory element of the third embodiment are given by way of examples. Therefore, the invention may be applied to TMR elements, thin-film magnetic heads and memory elements having any other configurations as long as they have sidewalls formed through etching and depositions layers on which processing for increasing the resistance value has been performed.

The tunnel magnetoresistive element, the thin-film magnetic head or the memory element of the invention described so far each comprise the deposition layer made of the material that has been separated by etching and deposited on the sidewalls and undergone oxidation or nitriding. This deposition layer has a greater resistance value. It is thereby possible to prevent formation of channels of extra currents that would not contribute to the tunnel magnetoresistive effect.

According to the methods of manufacturing the tunnel magnetoresistive element, the thin-film magnetic head or the memory element of the invention, the resistance value of the deposition layer is increased, the deposition layer being made of the material that has been separated by etching and deposited on the sidewalls. It is thereby possible to prevent formation of channels of extra currents that would not contribute to the tunnel magnetoresistive effect.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a tunnel magnetoresistive element comprising a tunnel barrier layer and first and second magnetic layers sandwiching the tunnel barrier layer, the method including the steps of:

forming the first magnetic layer;

forming the tunnel barrier layer on the first magnetic layer;

forming the second magnetic layer on the tunnel barrier layer;

etching at least the second magnetic layer and the tunnel barrier layer selectively so that at least the second magnetic layer and the tunnel barrier layer have sidewalls formed via the etching, and that a conductive deposition layer is formed on the sidewalls, the deposition layer comprising a substance depositing on the sidewalls in the course of the etching; and performing processing for increasing a resistance value of the deposition layer after performing the step of etching.

2. The method according to claim 1 wherein the processing for increasing the resistance value of the deposition layer is oxidation or nitriding of the deposition layer.

3. A method of manufacturing a thin-film magnetic head incorporating a tunnel magnetoresistive element comprising a tunnel barrier layer and first and second magnetic layers sandwiching the tunnel barrier layer, the method including the steps of:

forming the first magnetic layer;

forming the tunnel barrier layer on the first magnetic layer;

forming the second magnetic layer on the tunnel barrier layer;

etching at least the second magnetic layer and the tunnel barrier layer selectively so that at least the second magnetic layer and the tunnel barrier layer have sidewalls formed via the etching, and that a conductive deposition layer is formed on the sidewalls, the deposition layer comprising a substance depositing on the sidewalls in the course of the etching; and performing processing for increasing a resistance value of the deposition layer after performing the step of etching.

4. The method according to claim 3 wherein the processing for increasing the resistance value of the deposition layer is oxidation or nitriding of the deposition layer.

5. A method of manufacturing a memory element incorporating a tunnel magnetoresistive element comprising a tunnel barrier layer and first and second magnetic layers sandwiching the tunnel barrier layer, the method including the steps of:

forming the first magnetic layer;

forming the tunnel barrier layer on the first magnetic layer;

forming the second magnetic layer on the tunnel barrier layer;

etching at least the second magnetic layer and the tunnel barrier layer selectively so that at least the second magnetic layer and the tunnel barrier layer have sidewalls formed via the etching, and that a conductive deposition layer is formed on the sidewalls, the deposition layer comprising a substance depositing on the sidewalls in the course of the etching; and performing processing for increasing a resistance value of the deposition layer after performing the step of etching.

6. The method according to claim 5 wherein the processing for increasing the resistance value of the deposition layer is oxidation or nitriding of the deposition layer.

* * * * *